US007612993B1

(12) United States Patent
Takei et al.

(10) Patent No.: US 7,612,993 B1
(45) Date of Patent: Nov. 3, 2009

(54) CARD CONNECTOR

(75) Inventors: Kazunori Takei, Tokyo (JP); Hitoshi Kikuchi, Tokyo (JP); Hirokazu Takahashi, Tokyo (JP); Hiromichi Kato, Tokyo (JP)

(73) Assignee: DDK Ltd., Tokyo (JP)

( * ) Notice: Subject to any disclaimer, the term of this patent is extended or adjusted under 35 U.S.C. 154(b) by 0 days.

(21) Appl. No.: 12/218,555

(22) Filed: Jul. 15, 2008

(51) Int. Cl.
*H05K 5/00* (2006.01)
*H05K 7/00* (2006.01)
*H01R 13/44* (2006.01)
*H01R 24/00* (2006.01)

(52) U.S. Cl. ............................ 361/679.31; 361/679.32; 361/679.58; 439/140; 439/631

(58) Field of Classification Search ............ 361/679.31, 361/679.32, 679.58; 439/140, 159, 630, 439/631
See application file for complete search history.

(56) References Cited

U.S. PATENT DOCUMENTS 6,991,480 B2 * 1/2006 Katayanagi et al. ......... 439/159
2006/0025019 A1 * 2/2006 Zhu et al. .................. 439/630

FOREIGN PATENT DOCUMENTS

JP 2005-340141 8/2005
JP 2006120482 5/2006
JP 2007144695 6/2007
JP 2007250324 9/2007

* cited by examiner

*Primary Examiner*—Jayprakash N Gandhi
*Assistant Examiner*—Anthony M Haughton
(74) *Attorney, Agent, or Firm*—Abelman, Frayne & Schwab

(57) ABSTRACT

A card connector includes a plurality of contacts adapted to contact memory cards, a housing holding the contacts and having a plurality of inserting openings arranged in vertically overlapping relationship for inserting memory cards, respectively, and a shell covering the housing. A pivot member is installed at a predetermined position in the housing so as to be pivotally moved when one memory card is inserted in one of the inserting openings such that part of the pivot member extends into all the inserting openings except for the one inserting opening, thereby preventing a further memory card from being inserted into the card connector. In assembling, after the pivot member is set in the housing so that protrusions provided in the housing are fitted in slits formed in the pivot member, the shell is fitted on the housing to push the pivoting member into the predetermined position.

4 Claims, 4 Drawing Sheets

CARD CONNECTOR

BACKGROUND OF THE INVENTION

This invention relates to a card connector for use in various electric and electronic appliances such as printers, card readers and the like for inputting and outputting signals into and from memory cards of a plurality of kinds inserted into the card connector, and more particularly to a card connector having a structure permitting one memory card only to be inserted at a time.

In recent years, with the widespread use of digital cameras and the like, memory cards having a large storage capacity and a compact shape have been used. A wide variety of cards have been used depending upon characteristics and the like of appliances with which the memory cards are used, and therefore card connectors adapted to accommodate cards of a plurality of kinds will be favorable. With such card connectors adapted to receive the cards of different kinds, however, it will be required to prevent a plurality of cards from being inserted into a card connector at a time.

Card connectors have been proposed, which may enable cards of a plurality of kinds to be received and prevent a further card from being inserted into a card connector when a first card has been inserted therein.

As examples of such card connectors, incorporated herein are United States Patent Application Publication No. 2006/0025019 (Patent Literature 1), and as those proposed by the applicant of the present application, Japanese Patent Application Opened No. 2005-340,141 (Patent Literature 2), Japanese Patent Application Opened No. 2006-120,482 (Patent Literature 3), and Japanese Patent Application Opened No. 2007-250,324 (Patent Literature 4).

Patent Literature 1

The card connector according to the United States Patent Application Publication No. 2006/0025019 comprises an insulating housing 1 defining adjacent card cavities 11, 12, 13 and 14; a plurality of card contacts 2, 3, 4 and 5 retained in the housing to expose to the corresponding card cavities; and at least one controlling member 6 or 7 disposed in the housing between the two card cavities, and comprising upper and lower protrusions 62 and 63 deflected between the two card cavities and protruding into the one card cavity when a card has been inserted into the other card cavity, and a resilient portion 61 for urging the upper and lower protrusions to resume their original positions when the card has been withdrawn from the other cavity.

Patent Literature 2

The card connector removably receiving a plurality of memory cards disclosed in the Japanese Patent Application Opened No. 2005-340,141, includes a required number of contacts 13 adapted to contact connecting portions of the memory cards 45, and a housing 12 arranging and holding the contacts 13 therein and having a plurality of inserting openings 23 into which the plurality of memory cards 45 are inserted, respectively, wherein the housing 12 is provided at predetermined positions with at least one locking member 20 movable or pivotally movable when a memory card is inserted and with at least one spring member 18 displaceable when the memory card is inserted, thereby enabling one memory card only to be inserted when another memory card has been inserted with the aid of the locking member 20 and the spring member 18.

Patent Literature 3

The card connector into which a plurality of memory cards 50 are removably inserted, disclosed in Japanese Patent Application Opened No. 2006-120,482 includes a plurality of contacts 14 adapted to contact connection portions of the plurality of the memory cards 50, and a housing 12 arranging and holding the contacts 14 therein and having a plurality of inserting openings 22 into which the plurality of memory cards are inserted, respectively, wherein the card connector comprises a required number of sliders 20 arranged at predetermined positions in the housing 12 for forming parts of the plurality of inserting openings, and a required number of holders 18 arranged at predetermined positions in the housing for movably holding the sliders 20, thereby preventing more than one memory card from being inserted into the card connector by means of the sliders 20 at a time.

Patent Literature 4

The card connector into and from which two memory cards are detachably inserted and removed disclosed in the Japanese Patent Application Opened No. 2007-250,324 includes contacts 14 and 16 of two kinds for the two memory cards 501 and 502, respectively, each adapted to contact a connection portion of the memory card, and a housing 12 having two inserting openings 221 and 222 each into which the respective memory card is inserted and arranging and holding the contacts, wherein the two inserting openings 221 and 222 provided in the housing are arranged one above the other substantially in parallel relationship, and an insertion-preventing member 20 is arranged in a position between the inserting openings so as not to contact the contacts of two kinds so that once either of the memory cards has been inserted, the other memory card is prevented from being inserted by means of the insertion-preventing member.

In the Patent Literature 1 (United States Patent Application Publication No. 2006/0025019), first and second resilient members 6 and 7 serve to prevent a plurality of cards from being inserted at a time. Now, the first resilient member 6 will be considered because the second resilient member 7 is similar in operation to the first resilient member 6. The first resilient member 6 formed from a sheet metal comprises a securing portion 60, a resilient portion 61, and a first stopper having an upper protrusion 62 and a lower protrusion 63. The securing portion 60 is secured in a locking slot 1022 formed in the housing, and the first stopper having the upper and lower protrusions 62 and 63 is disposed in a groove 1021 formed in the housing. When a CF card is inserted into the CF card cavity 11, the CF card engages and pushes the upper protrusion 62 downwardly along the groove 1021 with the aid of elastic deformation of the resilient portion 61. As a result of this, the lower protrusion 63 extends into the SD/MMC card cavity 12, the MS card cavity 13 and the XD card cavity 14. In this case, the prevention of the insertion of other memory cards relies upon the elastic deformation of the resilient member 6. Therefore, the prevention of the insertion of the other cards would lack accuracy and reliability. The installation of the resilient member 6 in the locking slot 1022 and groove 1021 formed in the housing would have a risk of dislodgment of the resilient member from the card connector over time and would increase the number of producing steps to increase a production cost.

In the Patent Literature 2 (Japanese Patent Application Opened No. 2005-340,141), the locking member 20 is substantially in the form of a triangular plate whose one vertex is pivotally mounted in the housing 12. When a memory card 45 is inserted into either of inserting holes 23 arranged side by side in the lower stage of the connector, the memory card 45 pushes one vertex 34 of the locking member 20 so as to cause the other vertex 34 to extend into the remaining inserting hole 23, thereby preventing a memory card from being inserted into the remaining inserting hole 23. The spring member 18 made of a metal includes a fixed portion 29 to be fixed to the housing 12, an elastic portion 28 and two extending portions 30 extending in both width directions. The spring member 18 is inserted into and fixed to the housing 12 such that the elastic portion 28 of the spring member 18 extends into the inserting hole 23 in the upper stage of the connector. When a memory card 45 is inserted into the inserting hole 23 in the upper stage of the housing 12, the memory card 45 pushes the elastic portion 28 of the spring member 18 downward to cause the two extending portions 30 of the spring member 18 to extend into the inserting holes 23 arranged side by side in the lower stage of the connector, thereby preventing a memory card 45 from being inserted into the inserting holes 23 in the lower stage after a memory card has been inserted in the inserting hole in the upper stage. The idea using an elastic member for preventing a memory card from being inserted is substantially similar to that in the Patent Literature 1 so that this construction would be devoid of accuracy and reliability and further there would be a tendency for the spring member 18 to be dislodged. Moreover, the operation for mounting the locking member 20 in the housing in a pivotally movable manner is complicated to increase the number of producing steps to increase a production cost.

In the Patent Literature 3 (the Japanese Patent Application Opened No. 2006-120,482), the slider 20 is substantially rectangular and formed from a plastic material but may be from a metal. The slider 20 comprises recesses 30, a protrusion 32, and an elongate inserting aperture 28 into which the holder 18 is inserted for the purpose of sliding the slider 20 along the holder in the directions of the thickness of the connector. The four recesses 30 form parts of inserting openings 221, 223, 224 and 225 arranged side by side and one above the other, and one protrusion 32 forms part of an inserting opening 222 arranged below and at an intermediate position of the four inserting openings. When a memory card is inserted into one inserting opening, this memory card is also simultaneously inserted into one of the recess corresponding to the inserting opening and moves the slider in the vertical direction so that the other recesses and the protrusion extend into the other inserting openings, thereby preventing another memory card from being inserted into the remaining inserting openings. Although this construction has an advantage for accommodating many kinds of memory cards, the construction would be complicated to increase its manufacturing cost, and would experience deterioration and failure over time.

In the Patent Literature 4 (the Japanese Patent Application Opened No. 2007-250,324), the insertion-preventing member 20 serves to prevent a further memory card from being inserted into the card connector after a memory card has been inserted. The insertion-preventing member 20 is made of a metal or a plastic material and comprises a holding portion 28 for holding the member 20 in the housing 12, an elastic portion 32, and an upper projection 301 and a lower projection 302. When one memory card 50 is inserted into one inserting opening 22, the projection 301 or 302 is pushed downwardly or upwardly by the memory card 50 so that the elastic portion 32 of the member 20 is deformed downwardly or upwardly, with the result that the projection 302 or 301 is extended into the other inserting opening 22. In this way, a further memory card cannot be inserted and hence only one memory card 50 is permitted to be inserted. Although the card connector achieves its purpose with the simple construction, the function of the insertion-preventing member 20 is limited to the case having only two inserting openings for memory cards one above the other.

SUMMARY OF THE INVENTION

In view of the problems of the prior art described above, the invention has been completed and has an object to provide a card connector which accommodates many memory cards of different kinds and reliably operates with a high accuracy and which is particularly simple and inexpensive to manufacture, easy to install a key part, and rugged and durable in use.

The object of the invention described above can be achieved by the card connector 16 into and from which a plurality of memory cards are detachably inserted and removed, including a required number of contacts 18 adapted to contact connection portions of the memory cards, a housing 1 arranging and holding said contacts 18 and having a plurality of inserting openings arranged in vertically overlapping relationship for inserting said memory cards, respectively, and a shell 13 covering said housing 1, wherein a pivot member 4 is installed at a predetermined position in said housing 1 so as to be pivotally moved upon one memory card being inserted into one of said inserting openings such that part of said pivot member 4 extends into all the inserting openings except for said inserting opening into which said one memory card has been inserted, thereby permitting a memory card of one kind only to be inserted into the card connector at a time.

In one preferred embodiment, said pivot member 4 is provided on both sides with axles 6 for its pivotal movement, said axles 6 being each formed at its tip with a slit 7, and said housing 1 is formed with a through-hole 5 for pivotally accommodating said pivot member 4, having bearing grooves 8 for said axles 6 of the pivot member 4, said bearing grooves 8 being each formed with a protrusion 9 which is fitted in said slit 7 of the pivot member 4 and located at a position short of said predetermined position where said pivot member 4 is finally installed in the housing 1.

In installing said pivot member 4 in the housing 1, the pivot member 4 is set in the housing 1 such that said protrusions 9 of the housing 1 are fitted in said slits 7 of the axles 6 of said pivot member 4, and said shell 13 is fitted on the housing 1 so that the pivot member 4 is pushed inwardly into the housing 1 so as to permit the slits 7 of said pivot member 4 to pass through the protrusions 9 completely and the pivot member 4 is installed in the predetermined position.

In one embodiment, said shell 13 is fitted on the housing 1 by sliding said shell 13 on the housing 1 from the side of said inserting openings of the housing 1.

In a preferred embodiment, the card connector 16 comprises two inserting openings, of which upper one is for a memory card of one kind and the lower one is for memory cards of two kinds.

The card connector according to the invention brings about the following significant functions and effects.

(1). The card connector according to the invention is simple in construction to permit only one memory card to be inserted at a time and hence eliminates any errors in integrated circuits for controlling the memory cards with a high accuracy and a high reliability.

(2) The card connector according to the invention employs the pivot member 4 as a key part for preventing a memory card from being inserted into the card connector after a memory card has been inserted. The pivot member 4 is simple in construction and economically manufactured. Once the slits 7 of the pivot member 4 have passed through the protrusions 9 of the housing 1 and hence the pivot member 4 has been installed in the predetermined position in the housing 1, it becomes impossible to dislodge the pivot member 4 from the predetermined position so that the card connector according to the invention is reliable and ragged and durable in use.

(3) According to the invention, in installing the pivot member 4 in the housing 1, the pivot member 4 is set in the proximity of the opening of the through-hole 5 such that the protrusions 9 of the housing 1 are fitted in the slits 7 of the pivot member 4 to temporarily support the pivot member 4 at upper portion of the through-hole 5, and thereafter the shell 13 is slid on the housing 1 from the side of its inserting openings so as to be fitted on the housing. Therefore, the pivot member 4 is pushed inwardly into the housing 1 by the shell 13 so that the slits 7 of the pivot member 4 pass through the protrusions 9 so as to permit the pivot member 4 to be installed in the predetermined position in the housing 1. Accordingly, the assembling of the pivot member 4 into the housing is so simplified and achieved with great certainty and with less steps of production process which contribute to the inexpensive production.

The invention will be more fully understood by referring to the following detailed specification and claims taken in connection with the appended drawings.

DESCRIPTION OF THE PREFERRED EMBODIMENT

Figure 1A:
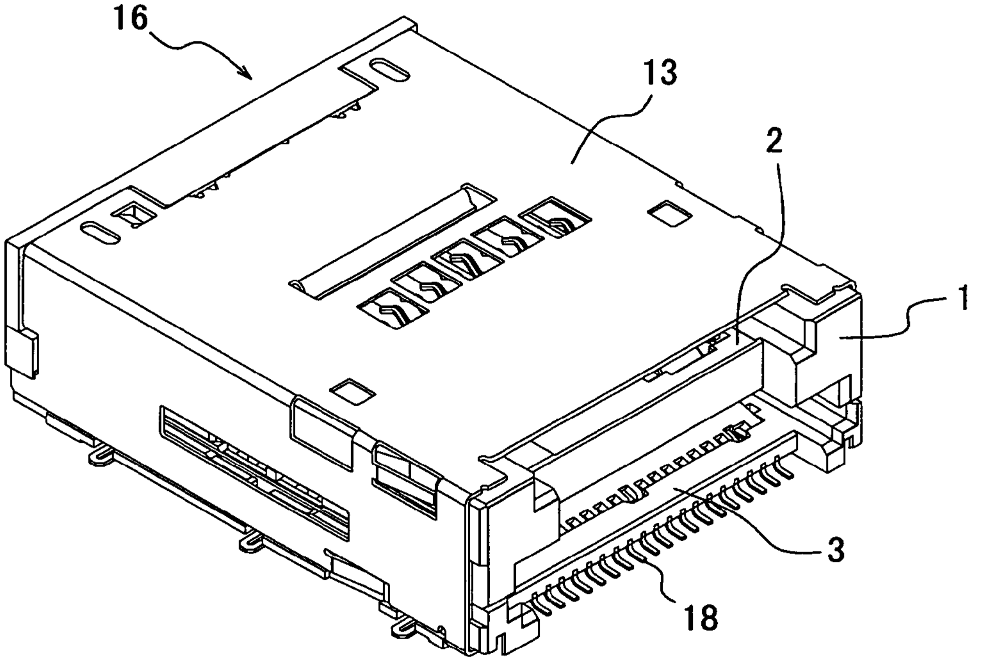
FIG. 1A is a perspective view of the card connector according to one embodiment of the invention viewed from the side of the inserting opening.
Figure 1B:
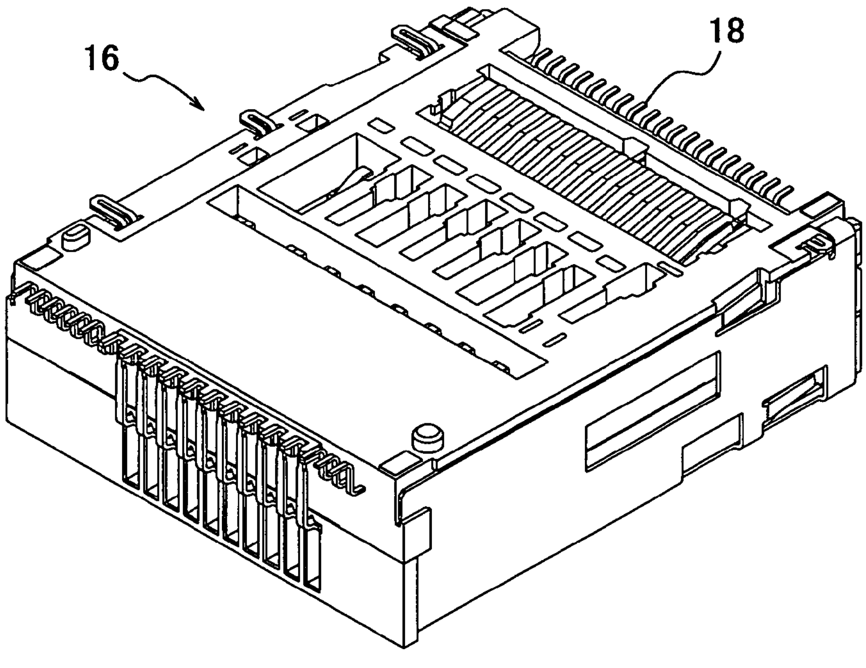
FIG. 1B is a perspective view of the card connector shown in FIG. 1A turned upside down viewed from the opposite side of the inserting opening.
Figure 2:
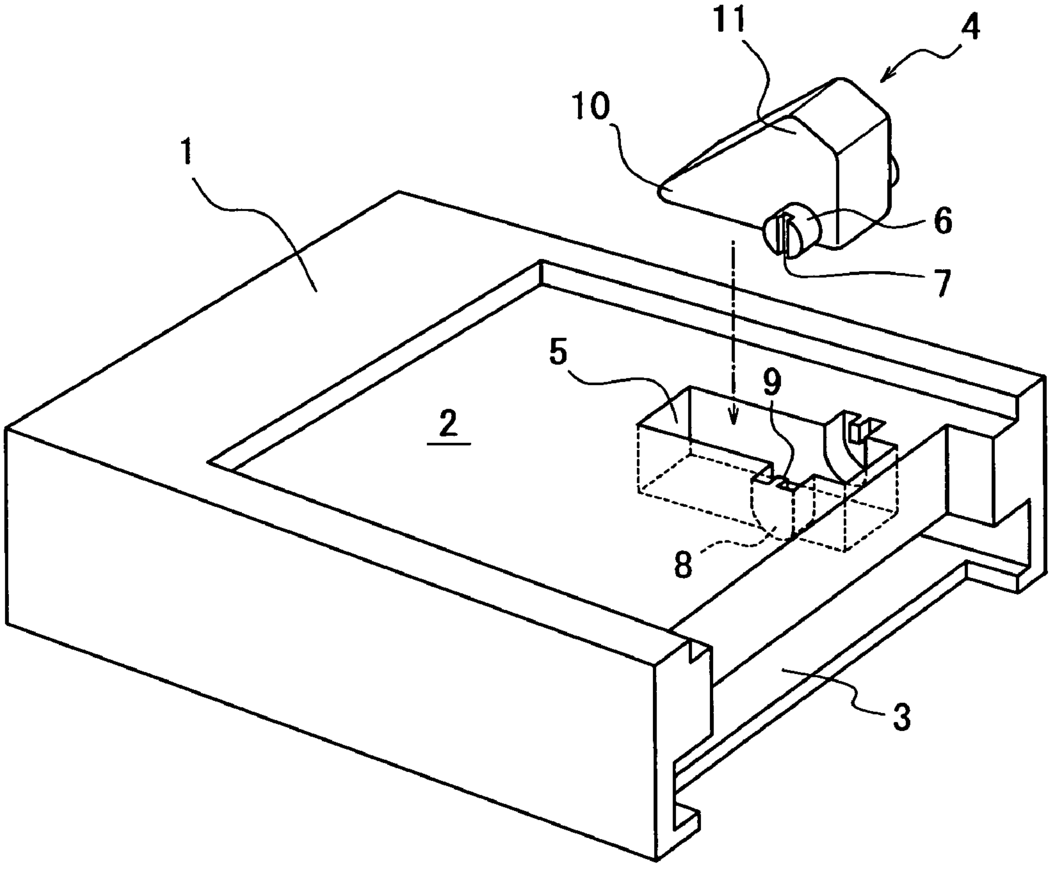
FIG. 2 is a perspective view of a housing of the card connector according to one embodiment of the invention.
Figure 3A:
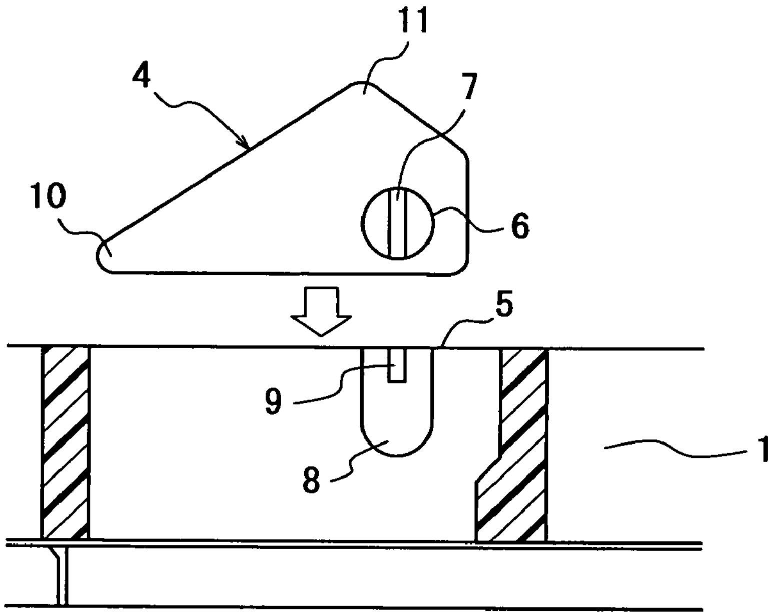
FIG. 3A is a partly sectional view of the housing illustrating a pivot member before being installed into the housing.
Figure 3B:
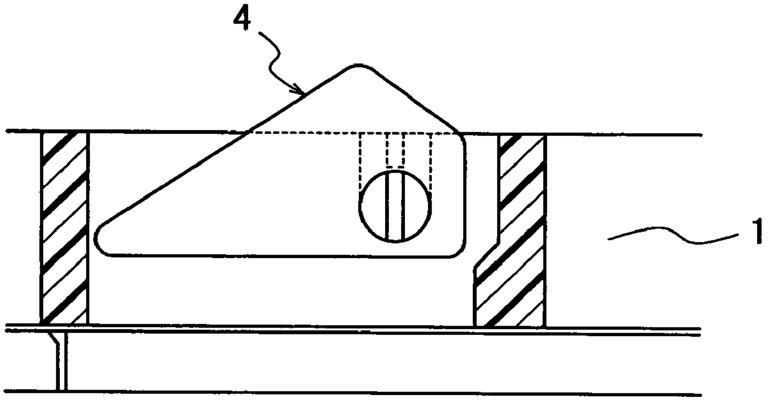
FIG. 3B is a partly sectional view of the housing illustrating the pivot member reached its installed position.
Figure 3C:
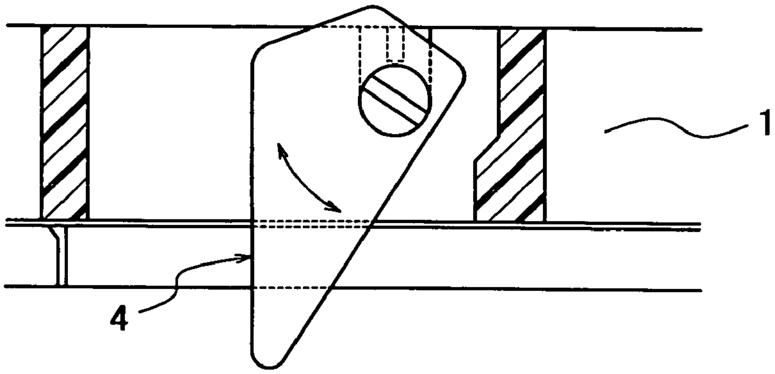
FIG. 3C is a partly sectional view of the housing illustrating the pivot member which has been pivoted.

One preferred embodiment of the card connector according to the invention will be explained hereinafter with reference to FIGS. 1 to 4D.

The card connector 16 according to the invention mainly comprises a number of contacts 18 adapted to contact connection portions of memory cards, a housing 1 holding the contacts 18 and having inserting openings for inserting the memory cards, a metal shell 13 covering the housing 1, and a pivot member 4 which is the subject matter of the invention.

The contacts 18 are not described because they are presumed to be obvious. First, the pivot member 4 will be explained. The pivot member 4 is formed from an electrically insulating plastic material by means of the injection molding of the known technique. The materials for the pivot member 4 may be suitably selected in consideration of durability, dimensional stability, workability, manufacturing cost, and the like and generally include polybutylene terephthalate (PBT), polyamide (66PA or 46PA), liquid crystal polymer (LCP), polycarbonate (PC) and the like and combination thereof.

The pivot member 4 is in the form of a particular quadrilateral having a required thickness of a few mm and is formed with cylindrical axles 6 for its pivotal movement, located in the proximity of a right-angled apex. Each of the axles 6 is formed at the tip with a slit 7 extending substantially at right angles to the longest side forming the right-angled apex in the illustrated embodiment in FIG. 3A or FIG. 3B. Operations of the pivot member 4 will be explained after following description of the housing 1 and setting of the pivot member 4 in the housing 1.

Figure 4A:
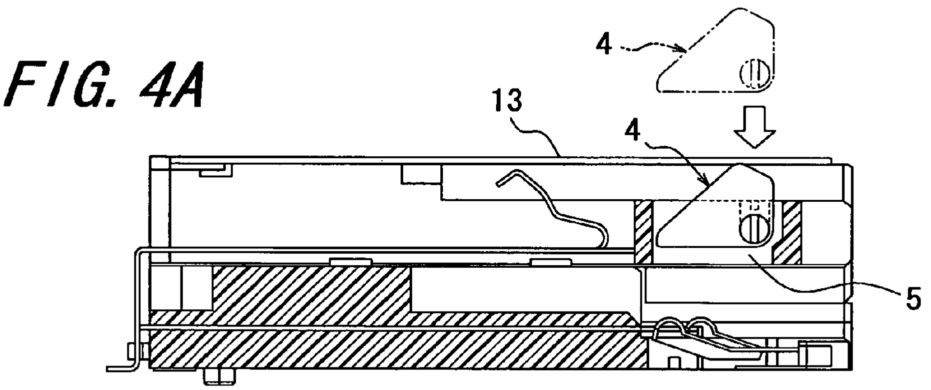
FIG. 4A is a sectional view of the card connector according to the invention.
Figure 4B:
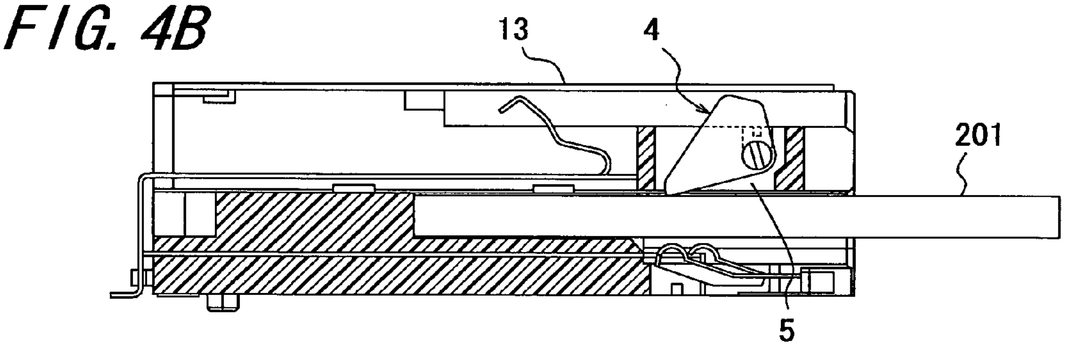
FIG. 4B is a sectional view of the card connector into which an SD card has been inserted.
Figure 4C:
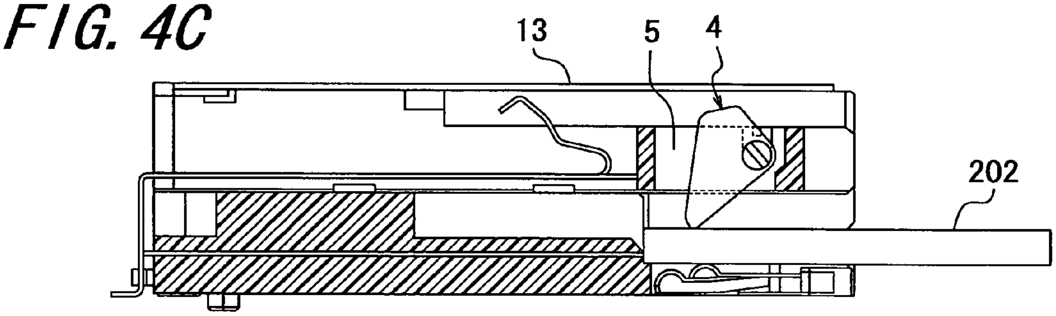
FIG. 4C is a sectional view of the card connector into which an xD card has been inserted.
Figure 4D:
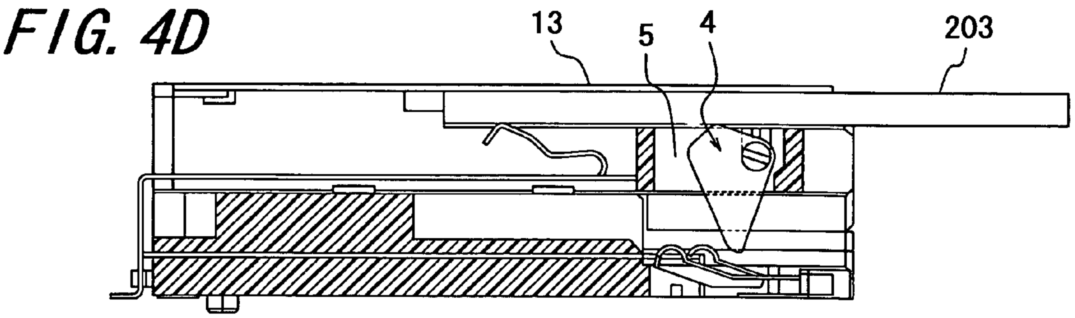
FIG. 4D is a sectional view of the card connector into which a Duo card has been inserted.

The housing 1 will then be explained. The housing 1 is made of an insulating plastic material and is formed with a rectangular recess 2. An upper inserting hole for a memory card, for example, a duo card 203 as shown in FIG. 4D is formed by the rectangular recess 2 and the shell 13 fitted on the housing 1. The housing 1 is further formed with a lower inserting hole 3 for memory cards, for example, an SD card 201 and an xD card 202 as shown in FIGS. 4B and 4C. The upper inserting hole formed by the rectangular recess 2 and the lower inserting hole 3 are positioned in vertically overlapping relationship with each other. The housing 1 is further formed with a rectangular through-hole 5 passing through the wall between the recess 2 and the inserting hole 3 for pivotally accommodating the pivot member 4 therein. The through-hole 5 has a width and a length for permitting the pivot member 4 to be pivotally moved within the through-hole 5.

The housing 1 is formed in both inner side surfaces of the through-hole 5 with bearing grooves 8 substantially perpendicularly to the rectangular recess 2 and extending about halfway in the wall between the recess 2 and the inserting hole 3. The lower ends of the bearing grooves 8 are shaped and located to support the axles 6 of the pivot member 4 so as to install the pivot member 4 in a predetermined position enabling the pivot member 4 to perform its function described below. The housing 1 is further formed with protrusions 9 only at the upper ends of the bearing grooves 8 at locations short of the predetermined position so as to be fitted in the slits 7 of the pivot member 4 when it is set at the upper portion of the through-hole 5 of the housing 1. The fitting between the protrusions 9 and the slits 7 is to an extent such that the pivot member can be temporarily supported but can be pushed into the through-hole 5 by a slight force. The function of the slits 7 and the protrusions 9 will be explained hereafter.

In setting the pivot member 4 in the housing 1, the pivot member 4 is set in the housing 1 so as to permit the pivot member 4 to be temporarily held at the upper portion of the through-hole 5 by the fitting between the protrusions 9 of the housing 1 and the slits 7 of the pivot member 4. Thereafter, the shell 13 is fitted on the housing 1 by sliding the shell 13 on the housing 1 from the side of inserting openings, that is, the right side in FIG. 2. As a result, the pivot member 4 is pushed at its corner 11 downwardly into the through-hole 5 so that the slits 7 of the pivot member 4 completely pass through the protrusions 9 of the housing 1, and the axles 6 of the pivot member 4 arrive at the bottoms of the bearing grooves 8, with the result that the pivot member 4 is seated at the predetermined position and then pivotally moved by the force of gravity because the center of gravity of the pivot member 4 is out of the center of the axles 6. After the pivot member 4 is installed in the housing 1 in this manner, the pivot member 4 is never dislodged from its installed position, because in order to remove the pivot member 4 from the housing 1, the slits 7 of the pivot member 4 must necessarily be brought into alignment with protrusions 9 of the through-hole 5 and forced to be fitted with the protrusions 9 and thereafter the pivot member 4 must be pulled upwardly in the vertical direction viewed in the drawings.

The operation of the pivot member 4 will be explained with reference to, by way of example, FIGS. 4B to 4D. Under the condition that there is no memory card inserted, when a Duo card 203 is inserted into the upper inserting opening (FIG. 4D), the pivot member 4 is pushed by the card so as to be pivotally moved in a counterclockwise direction as viewed in the drawing so that the part of the pivot member 4 extends into the lower inserting opening, making it impossible to insert an SD card 201 or an xD card 202 into the lower inserting opening. Under the condition that there is no card inserted, when an SD card 201 is inserted into the lower inserting opening (FIG. 4B), the pivot member 4 is pushed by the card so as to be pivotally moved in a clockwise direction as viewed in the drawing so that other part of the pivot member 4 extends into the upper inserting opening, making it impossible to insert a Duo card 203 into the upper inserting opening. There is a space below the inserted SD card 201, but the space, particularly its height is not enough to insert an xD card 202 into the space, thereby preventing the xD card 202 from being further inserted into the lower inserting opening. Under the condition that there is no memory card inserted, when an xD card 202 is inserted into the lower inserting opening (FIG. 4C), the pivot member 4 is pushed by the card so as to be pivotally moved in a clockwise direction as viewed in the drawing so that the part of the pivot member 4 extends into the upper inserting opening, making it impossible to insert a Duo card 203 into the upper inserting opening. There is a space above the inserted xD card 202, but the space, particularly its height is not enough to insert an SD card 201 into the space, thereby preventing the SD card 201 from being inserted into the lower inserting opening. In this manner, after a memory card has been inserted into the card connector, a further memory card is prevented from being inserted into the card connector with the pivotal movement of the pivot member 4 and the relation between the height of the inserting opening and thicknesses of the memory cards.

In this particular case, an MMC card can also be inserted into the lower inserting hole for the SD card 201 so that the card connector illustrated in FIGS. 4A to 4D accommodates the memory cards of four kinds, that is, Duo, SD, MMC and xD cards.

The particular feature of the present invention is the pivot member 4 having a particular quadrilateral form and having cylindrical axles 6 at both sides. The axles 6 are provided with vertically cut slits 7 at top thereof. By providing bearing grooves 8 having bottom shape to allow rotation of the pivot member 4. Further the bearing grooves 8 are provided with top protrusions 9 to allow the pivoting member 4 in the setting location to allow pivoting movement and also prevent dropping off unless the pivot member has position to bring the slit 7 at vertical position to pass the protrusions 9 extending from both sides.

By this such parts, like shaft and fixing means may be eliminated to help low manufacturing cost and save weight.

While the invention has been particularly shown and the described with reference to preferred embodiments thereof, it will be understood by those skilled in the art that the foregoing and other changes in form and details can be made therein without departing from the spirit and scope of the invention.

What is claimed is:

1. A card connector into and from which a plurality of memory cards are detachably inserted and removed, including a required number of contacts adapted to contact connection portions of said memory cards, a housing arranging and holding said contacts and having a plurality of inserting openings arranged in vertically overlapping relationship for inserting said memory cards, respectively, and a shell covering said housing, wherein a pivot member is installed at a predetermined position in said housing so as to be pivotally moved upon one memory card being inserted into one of said inserting openings such that part of said pivot member extends into all the inserting openings except for said inserting opening into which said one memory card has been inserted, thereby permitting a memory card of one kind only to be inserted into the card connector at a time, wherein said pivot member is provided on both sides with axles for its pivotal movement, said axles being each formed at its tip with a slit, and said housing is formed with a through-hole for pivotally accommodating said pivot member, having bearing grooves for said axles of the pivot member, said bearing grooves being each formed with a protrusion which is fitted in said slit of the pivot member and located at a position short of said predetermined position where said pivot member is finally installed in the housing.

2. The card connector as claimed in claim 1, wherein in setting said pivot member in the housing, the pivot member is set in the housing such that said protrusions of the housing are fitted in said slits of the axles of said pivot member, and said shell is fitted on the housing so that the pivot member is pushed inwardly into the housing so as to permit the slits of said pivot member to pass through the protrusions completely and the pivot member is installed in a rotatable manner in the predetermined position.

3. The card connector as claimed in claim 2, wherein said shell is fitted on the housing by sliding said shell on the housing from the side of said inserting openings of the housing.

4. The card connector as claimed in any one of claims 1 to 3, comprising the two inserting openings, of which upper one is for a memory card of one kind and the lower one is for memory cards of two kinds.

* * * * *